United States Patent [19]

Iwayanagi et al.

[11] Patent Number: 4,469,778
[45] Date of Patent: Sep. 4, 1984

[54] PATTERN FORMATION METHOD UTILIZING DEEP UV RADIATION AND BISAZIDE COMPOSITION

[75] Inventors: Takao Iwayanagi, Tokyo; Takahiro Kohashi, Hachioji; Saburo Nonogaki, Tokyo; Yoshio Hatano, Urawa, all of Japan

[73] Assignee: Hitachi, Ltd., Tokyo, Japan

[21] Appl. No.: 484,847

[22] Filed: Apr. 14, 1983

Related U.S. Application Data

[60] Division of Ser. No. 279,551, Jul. 1, 1981, abandoned, which is a continuation of Ser. No. 096,463, Nov. 21, 1979, abandoned.

[30] Foreign Application Priority Data

Dec. 1, 1978 [JP] Japan .................................. 53-147872
Sep. 7, 1979 [JP] Japan .................................. 54-114185

[51] Int. Cl.³ .......................... G03C 5/16; G03F 7/26
[52] U.S. Cl. .................................. 430/325; 430/167; 430/194; 430/197; 430/311; 430/927
[58] Field of Search ............... 430/197, 194, 196, 167, 430/927, 325, 311

[56] References Cited

U.S. PATENT DOCUMENTS

| | | | |
|---|---|---|---|
| 2,714,066 | 7/1955 | Jewett et al. | 430/175 |
| 2,852,379 | 9/1958 | Hepher et al. | 430/194 |
| 2,937,085 | 5/1960 | Seven et al. | 430/302 |
| 3,046,118 | 7/1962 | Schmidt | 430/193 |
| 3,287,128 | 11/1966 | Lugasch | 430/194 |
| 3,767,409 | 10/1973 | Grisdale et al. | 430/196 |
| 4,191,573 | 3/1980 | Toyama et al. | 430/156 |
| 4,347,300 | 8/1982 | Shimazu et al. | 430/167 |

OTHER PUBLICATIONS

Iwayanagi et al., "Azide Photoresists for Deep U.V. Lithography", *J. Electrochem. Soc.*, 12/1980, pp. 59–60.
Anon, "Kodak Photosensitive Resists for Industry", E. Kodak, First Ed., 1962, pp. 23–24.
De Forest, W. S., "Photoresist", McGraw-Hill Book Co., 1975, pp. 103–109.
Tsunoda et al., *Photo Sci. & Eng.*, vol. 17, No. 4, 1973, pp. 390–393.

*Primary Examiner*—Charles L. Bowers, Jr.
*Attorney, Agent, or Firm*—Antonelli, Terry & Wands

[57] ABSTRACT

Disclosed is a pattern formation method comprising exposing a photosensitive composition comprising a bisazide compound represented by the following general formula:

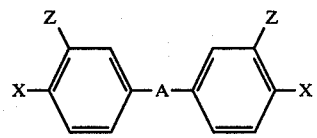

wherein A stands for an atom or atomic group selected from O, S, $CH_2$, $CH_2CH_2$, $SO_2$ and $S_2$, X stands for an atom or atomic group selected from H and $N_3$, and when X is H, Z is a group of $N_3$ and when X is $N_3$, Z is an atom of H or Cl, and a polymeric compound to deep UV rays, to form fine patterns.

24 Claims, No Drawings

PATTERN FORMATION METHOD UTILIZING DEEP UV RADIATION AND BISAZIDE COMPOSITION

This is a division of application Ser. No. 279,551, filed July 1, 1981, now abandoned, which is a continuation of Ser. No. 096,463, filed Nov. 21, 1979, now abandoned.

BACKGROUND OF THE INVENTION

The present invention relates to a photosensitive composition and a pattern formation method using the same.

With recent increase in the scale of integration and the packing density in solid state devices, it is required to form fine patterns at a high efficiency. When an electron beam sensitive composition is used, it is possible to form patterns having a width of, for example, about 1 μm. However, when the electron beam sensitive composition is exposed to electron beams, it is necessary to focus electron beams and apply the focussed electron beams to the surface from one end to the other end in sequence. Accordingly, a long time is required for exposing one workpiece to electron beams. For example, about 20 to about 50 minutes are necessary for exposing one workpiece having a surface area of 10 cm×10 cm, though this time varies to some extent depending on the sensitivity of the composition used and the kind of the pattern to be formed. Furthermore, irradiation should be conducted in vacuo and if the time and operation necessary for maintaining workpieces in vacuo are taken into account, exposure to electron beams is not preferred when devices are manufactured in large quantities on an industrial scale.

When a photosensitive composition is used and a workpiece is exposed to light through a mask, a pattern can be formed in a short time. Conventional photosensitive compositions are ordinarily sensitive to rays in the spectral region of 320 to 500 nm. When a workpiece is exposed to light having a wavelength in this region through a mask, because of diffraction and interference effects owing to inherent properties of this light, it is difficult to form a pattern having a width of 1 to 2 μm.

As means for forming such fine patterns, there has been proposed a method using ultraviolet rays of a shorter wavelength (hereinafter referred to as "deep UV light or ray") in the spectral region of 200 to 320 nm, preferably 200 to 300 nm. In this case, the diffraction and interference effects are reduced and finer patterns can be formed. As compounds sensitive to such deep UV light, there are known poly(methyl methacrylate) and poly(methylisopropenyl ketone). However, it has been found that the sensitivity to deep UV light of these compounds is very low and they have no practical utility.

List of the Prior Art

The following reference is cited to show the state of the art:
U.S. Pat. No. 2,852,379

SUMMARY OF THE INVENTION

It is a primary object of the present invention to provide a photosensitive composition having a high sensitivity and being capable of providing a fine pattern in a short time and a pattern forming method using this composition.

Another object of the present invention is to provide a photosensitive composition having a sensitivity to deep UV rays and a pattern forming method using this composition.

These and other objects can be attained by a pattern formation method comprising the steps of forming a film of a photosensitive composition comprising a bisazide compound represented by the following general formula:

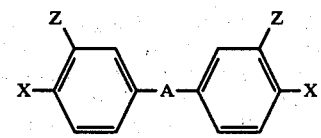

wherein A stands for an atom or atomic group selected from O, S, $CH_2$, $CH_2CH_2$, $SO_2$ and $S_2$, X stands for an atom or atomic group selected from H and $N_3$, and when X is H, Z is a group of $N_3$ and when X is $N_3$, Z is an atom of H or Cl, and a polymeric compound cross-linkable with a photochemical reaction product of said bisazide compound on a substrate, exposing said film to deep UV rays having a predetermined pattern and removing the unexposed area from said film by development.

DETAILED DESCRIPTION OF THE PREFERRED EMBODIMENTS

As the bisazide compound of the above general formula that is used for the composition of the present invention, there can be mentioned 4,4'-diazidodiphenyl ether, 4,4'-diazidodiphenyl sulfide, 4,4'-diazidodiphenyl sulfone, 3,3'-diazidodiphenyl sulfone, 4,4'-diazidodiphenyl methane, 3,3'-dichloro-4,4'-diazidodiphenyl methane, 4,4'-diazidodiphenyl disulfide and 4,4'-diazidobibenzyl. These compounds may be used singly or in the form of a mixture of two or more of them.

These bisazide compounds, except 4,4'-diazidodiphenyl methane, are novel compounds. 4,4'-Diazidodiphenyl methane is disclosed in U.S. Pat. No. 2,852,379, but the pattern formation process in which a photosensitive composition comprising this compound is exposed to deep UV rays is not disclosed in this U.S. patent.

The bisazide compounds that are used in the pattern formation method of the present invention are those represented by the above general formula. However, when A is $CH_2$ and X is $N_3$ in the above general formula, only the compound in which Z is Cl is used for the novel photosensitive composition of the present invention.

These bisazide compounds are synthesized by reacting a corresponding diamine compound with hydrochloric acid and sodium nitrite in an aqueous solution to effect diazotization and adding sodium azide to the resulting diazonium salt solution to convert the diazonium salt to a bisazide.

For example, when 4,4'-diaminodiphenyl ether is reacted in the above-mentioned manner, 4,4'-diazidodiphenyl ether having a melting point of 77° C. is obtained. In the same manner, 4,4'-diazidodiphenyl sulfide having a melting point of 90° C., 4,4'-diazidodiphenyl sulfone having a melting point of 163° C., 3,3'-diazidodiphenyl sulfone having a melting point of 116° C., 4,4'-diazidodiphenyl methane having a melting point of 44° C., 3,3'-dichloro-4,4'-diazidodiphenyl methane having a melting point of 128° C., 4,4'- diazidodiphenyl disulfide having a melting point of 37° C. and 4,4'-diazidodibenzyl having a melting point of 80° C. are prepared from the corresponding diamines, that is 4,4'-diaminodiphenyl sulfide, 4,4'-diaminodiphenyl sulfone, 3,3'-diaminodiphenyl sulfone, 4,4'-diaminodiphenyl methane, 3,3'-dichloro-4,4'-diaminodiphenyl methane, 4,4'-diaminodiphenyl disulfide and 4,4'-diaminobibenzyl, respectively.

As the polymeric compound crosslinkable with a photochemical reaction product of the above bisazide compound, there can be used organic solvent-soluble polymeric compounds, for example, natural rubber, denatured rubber such as cyclized natural rubber, synthetic rubbers such as polybutadiene, polyisoprene, cyclized polybutadiene, cyclized polyisoprene, polychloroprene, styrene-butadiene rubber and nitrile rubber, and synthetic polymers such as polystyrene, nylon, novolak resin, poly(vinyl phenol) and poly(vinyl butyral). A mixture of two or more of these polymeric compounds may be used. Among these polymeric compounds, rubber type compounds are preferred because they provide films excellent in various properties.

The photosensitive composition may be formed into a film according to various known methods. For example, a solution of the photosensitive composition is coated by spin coating, spray coating or the like and is then dried.

The so formed film is exposed to deep UV rays in the spectral region of 200 to 320 nm, preferably 200 to 300 nm. It is preferred that exposure be conducted through a mask having a predetermined pattern.

Development is performed according to the conventional method. More specifically, the development is carried out by using a solvent capable of dissolving therein the unexposed photosensitive composition but incapable of dissolving the crosslinked film therein. A mixture of two or more of solvents may be used.

The photosensitive composition of the present invention may be used under ordinary white lights, such as ordinary white fluorescent lights.

As the bisazide compound customarily used for the photosensitive composition, there can be mentioned 2,6-di(4'-azidobenzal)cyclohexanone and 2,6-di(4'-azidobenzal)-4-methylcyclohexanone. A photosensitive composition comprising such known bisazide compound and cyclized rubber has a sensitive spectral region of 300 to 500 nm, and fogging or photodecomposition is caused under white lights. Therefore, when such photosensitive composition is used, a yellow dark room using yellow light as safe light should be employed. Operation conditions in this yellow dark room are quite different from operation condition under white light, and as is well known, physiological disorders are caused in men working in the yellow dark room.

On the other hand, in the case of the photosensitive composition of the present invention, fogging or photodecomposition is not caused at all even under white light. Therefore, when the photosensitive composition of the present invention is used, all the pattern-forming steps of coating the photosensitive composition on a substrate, drying the coated composition, exposing the resulting film to deep UV rays and removing the unexposed area by development can be performed under white light.

As another advantage attained according to the pattern formation method of the present invention, there can be mentioned an advantage that when a certain bisazide compound represented by the above general formula is used, no oxygen effect is caused. Photosensitive compositions comprising a bisazide compound as the crosslinking agent ordinarily show an oxygen effect. More specifically, when exposure is carried out in an oxygen gas-containing atmosphere, the reaction is interfered and crosslinking of the surface of the film is inhibited or formation of the film is inhibited in an area of a low intensity of the exposing light. Therefore, a desired pattern is hardly formed in the film. As means for eliminating this disadvantage, there is adopted a method in which exposure is conducted in an inert gas such as nitrogen gas.

A photosensitive composition comprising as the crosslinking agent a bisazide compound of the above general formula wherein A is $SO_2$ has no oxygen effect. Accordingly, even if exposure is carried out in air, results same as results obtained in nitrogen gas can be obtained. Therefore, great industrial advantages can be attained when such photosensitive compositions are used.

As such effective bisazide compound, there can be mentioned 4,4'-diazidodiphenyl sulfone and 3,3'-diazidodiphenyl sulfone.

The present invention will now be described in detail with reference to the following Examples that by no means limit the scope of the invention.

EXAMPLE 1

In 90 g of xylene were dissolved 10 g of cyclized polyisoprene rubber and 0.1 g of 4,4'-diazidodiphenyl sulfide to form a photosensitive solution. This photosensitive solution was spin-coated on a silicon wafer having an oxide layer formed in the upper portion and was then dried to form a photosensitive film having a thickness of about 0.9 $\mu$m. The substrate was exposed for 2 seconds to rays from a 500 W xenon-mercury lamp in a nitrogen gas atmosphere through a chrome-on-quartz substrate mask. In order to eliminate influences of rays of a longer wavelength and prevent thermal expansion of the wafer by infrared heating, a cold mirror capable of transmitting rays having a wavelength longer than 300 nm was interposed between the light source and the mask. Therefore, the light reflected from the cold mirror did not include rays having a wavelength longer than 300 nm. The substrate thus exposed to deep UV rays having a wavelength of 200 to 300 nm was developed with a liquid developer comprising n-heptane and xylene and the photosensitive film in the unexposed area was removed to form patterns having a width of 1 $\mu$m at intervals of 2 $\mu$m.

The same experiment was carried out by using poly(methyl methacrylate) and poly(methylisopropenyl ketone) as the known deep UV resist. The exposure time necessary for obtaining good patterns was 400 seconds in the former resist and 80 seconds in the latter resist. Namely, the sensitivity of the above photosensitive composition according to the present invention was 200 times as high as the sensitivity of poly(methyl methacrylate) and 40 times as high as the sensitivity of poly(methylisopropenyl ketone).

EXAMPLES 2 TO 8

The experiment was carried out in the same manner as described in Example 1 by using the following bisazide compounds independently instead of 4,4'-diazidodiphenyl sulfide used in Example 1.

In each case, good fine patterns were obtained with the exposure time indicated below.

3,3'-diazidodiphenyl sulfone (12 seconds)
4,4'-diazidodiphenyl ether (4 seconds)
4,4'-diazidodiphenyl sulfone (6 seconds)
3,3'-dichloro-4,4'-diazidodiphenyl methane (6 seconds)
4,4'-diazidodiphenyl disulfide (10 seconds)
4,4'-diazidodiphenyl methane (6 seconds)
4,4'-diazidobibenzyl (4 seconds)

EXAMPLES 9 AND 10

By using the photosensitive compositions used in Examples 2 and 4, that is, the photosensitive composition comprising 3,3'-diazidodiphenyl sulfone and cyclized polyisoprene rubber and the composition comprising 4,4'-diazidodiphenyl sulfone and cyclized polyisoprene rubber, the treatment was carried out in the same manner as in Examples 2 and 4 except that the exposure was carried out in air. Obtained results were the same as the results obtained in Examples 2 and 4 where the exposure was carried out in nitrogen gas.

For comparison, a photosensitive composition comprising 4,4'-diazidodiphenyl methane and cyclized polyisoprene rubber was used and the exposure was carried out in air. The surface of the film was not crosslinked and the film thickness was insufficient.

EXAMPLE 11

In 97 g of cyclohexanone were dissolved 3 g of poly(vinyl butyral) and 0.2 g of 4,4'-diazidodiphenyl ether, and by using the so formed solution, the treatment was carried out in the same manner as described in Example 1. When the exposure was conducted for 4 seconds, good patterns were obtained.

EXAMPLE 12

In 90 g of xylene were dissolved 10 g of cyclized isoprene rubber and 0.3 g of 4,4'-diazidodiphenyl ether to form a sensitive solution. The solution was coated on two silicon wafers having an oxide layer formed in the upper portion and was then dried. One of them was exposed through a mask to rays from a xenon-mercury lamp according to a known method for the production of semiconductors and the resulting substrate was developed with xylene. The developed resist film thickness was determined. The other coated wafer was allowed to stand under ordinary white fluorescent lights for 6 hours. Then, the exposure and development were carried out under the same conditions as described above, and the developed resist film thickness was determined. It was found that the developed resist film thickness was not different from that determined when standing under ordinary white fluorescent lights was not conducted, and the obtained patterns were good in each case.

For comparison, the experiment was conducted in the same manner by using conventional 2,6-di(4'-azidobenzal)-4-methylcyclohexanone instead of 4,4'-diazidodiphenyl ether. When the coated wafer was allowed to stand under ordinary white fluorescent lights for 6 hours, the developed resist film thickness was zero and a film that could resist the post treatments was not obtained. More specifically, this conventional diazide compound was gradually subjected to photodecomposition under ordinary white fluorescent lights and the photosensitivity was degraded by oxygen.

As will be readily understood from these experimental results, the conventional photosensitive composition requires a treatment in a yellow dark room, but when the photosensitive composition of the present invention is used, a yellow dark room is not necessary and the composition of the present invention can be applied under ordinary white fluorescent lights.

EXAMPLES 13 TO 20

The treatment was carried out in the same manner as described in Example 12 except that 4,4'-diazidodiphenyl sulfide, 4,4'-diazidodiphenyl sulfone, 3,3'-diazidodiphenyl sulfone, 4,4'-diazidodiphenyl methane, 3,3'-dichloro-4,4'-diazidodiphenyl methane, 4,4'-diazidodiphenyl disulfide and 4,4'-diazidobibenzyl were used independently instead of 4,4'-diazidodiphenyl ether used in Example 12. In each case, good patterns were obtained under the same process conditions whether 6 hours' standing was conducted or 6 hours' standing was not conducted.

What is claimed is:

1. A pattern formation method comprising the first step of forming a film of a photosensitive composition comprising a bisazide compound, the bisazide compound being an organic solvent soluble compound, represented by the following general formula:

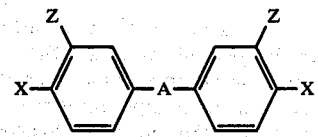

wherein A stands for an atom or atomic group selected from O, S, CH$_2$CH$_2$, SO$_2$ and S$_2$, X stands for an atom or atomic group selected from H and N$_3$, and when X is H, Z is a group of N$_3$ and when X is N$_3$, Z is an atom of H or C, and a polymeric compound, crosslinkable with a photochemical reaction product of said bisazide compound on a substrate, said polymeric compound being an organic solvent soluble polymeric compound, the amount of the bisazide compound used being sufficient for the photochemical reaction product thereof to cross-link the polymeric compound, the second step of exposing said film only to deep UV rays, of a wavelength of 200 to 320 nm, having a predetermined pattern and the third step of removing the unexposed area from said film by development using a solvent for the unexposed photosensitive composition.

2. A pattern formation method according to claim 1 wherein the polymeric compound is at least one member selected from the group consisting of natural rubber, cyclized natural rubber, polybutadiene, polyisoprene, cyclized polybutadiene, cyclized polyisoprene, polychloroprene, styrene-butadiene rubber, nitrile rubber, polystyrene, nylon, novolak resin, poly(vinyl phenol) and poly(vinyl butyral).

3. A pattern formation method according to claim 1 wherein exposure of the film to deep UV rays is carried out in an inert gas atmosphere.

4. A pattern formation method according to claim 1 wherein the bisazide compound is at least one member selected from the group consisting of 4,4'-diazidodiphenyl sulfone and 3,3'-diazidodiphenyl sulfone and exposure of the film to deep UV rays is carried out in an oxygen gas-containing atmosphere.

5. A pattern formation method according to claim 1 wherein the deep UV rays are those reflected from a cold mirror transmitting rays having a wavelength longer than a predetermined wavelength.

6. A pattern formation method according to claim 1 wherein A in the general formula is O.

7. A pattern formation method according to claim 6 wherein the bisazide compound is 4,4'-diazidodiphenyl ether.

8. A pattern formation method according to claim 6 wherein the deep UV rays have a wavelength of 200 to 300 nm.

9. A pattern formation method according to claim 1 wherein A in the general formula is S.

10. A pattern formation method according to claim 9 wherein the bisazide compound is 4,4'-diazidodiphenyl sulfide.

11. A pattern formation method according to claim 10 wherein the deep UV rays have a wavelength of 200 to 300 nm.

12. A pattern formation method according to claim 1 wherein A in the general formula is $CH_2CH_2$.

13. A pattern formation method according to claim 12 wherein the bisazide compound is 4,4'-diazidobibenzyl.

14. A pattern formation method according to claim 12 wherein the deep UV rays have a wavelength of 200 to 300 nm.

15. A pattern formation method according to claim 1 wherein A in the general formula is $SO_2$.

16. A pattern formation method according to claim 15 wherein the bisazide compound is at least one member selected from the group consisting of 4,4'-diazidodiphenyl sulfone and 3,3'-diazidodiphenyl sulfone.

17. A pattern formation method according to claim 15 wherein exposure of the film to deep UV rays is carried out in an oxygen gas-containing atmosphere.

18. A pattern formation method according to claim 15 wherein the deep UV rays have a wavelength of 200 to 300 nm.

19. A pattern formation method according to claim 1 wherein A in the general formula is $S_2$.

20. A pattern formation method according to claim 19 wherein the bisazide compound is 4,4'-diazidodiphenyl disulfide.

21. A pattern formation method according to claim 19 wherein the deep UV rays have a wavelength of 200 to 300 nm.

22. A pattern formation method according to claim 1 wherein A stands for an atom or atomic group selected from S and $SO_2$, and the polymeric compound is at least one member selected from the group consisting of natural rubber, cyclized natural rubber, polybutadiene, polyisoprene, cyclized polybutadiene, cyclized polyisoprene, polychloroprene, styrene-butadiene rubber, nitrile rubber, polystyrene, nylon, novolak resin, poly (vinyl phenol) and poly (vinyl butyral).

23. A pattern formation method according to claim 22, wherein said deep UV rays have a wavelength of 200 to 300 nm.

24. A pattern formation method according to claim 1, wherein said development is performed using an organic solvent for the unexposed photosensitive composition.

* * * * *